United States Patent
Shih

(10) Patent No.: US 9,257,565 B2
(45) Date of Patent: Feb. 9, 2016

(54) DISPLAY PANEL AND MANUFACTURING METHOD THEREOF

(71) Applicant: Ye Xin Technology Consulting Co., Ltd., Hsinchu (TW)

(72) Inventor: Po-Li Shih, Hsinchu (TW)

(73) Assignee: Ye Xin Technology Consulting Co., Ltd., Hsinchu (TW)

( * ) Notice: Subject to any disclaimer, the term of this patent is extended or adjusted under 35 U.S.C. 154(b) by 0 days.

(21) Appl. No.: 14/340,573

(22) Filed: Jul. 25, 2014

(65) Prior Publication Data

US 2015/0031168 A1 Jan. 29, 2015

(30) Foreign Application Priority Data

Jul. 25, 2013 (TW) ............................... 102126750 A

(51) Int. Cl.
  H01L 21/786 (2006.01)
  H01L 29/786 (2006.01)
  H01L 29/66 (2006.01)
  H01L 21/00 (2006.01)

(52) U.S. Cl.
  CPC ...... *H01L 29/7869* (2013.01); *H01L 29/66969* (2013.01)

(58) Field of Classification Search
  None
  See application file for complete search history.

(56) References Cited

U.S. PATENT DOCUMENTS

| | | | | |
|---|---|---|---|---|
| 5,299,041 A | * | 3/1994 | Morin et al. | 349/42 |
| 5,441,905 A | * | 8/1995 | Wu | 438/160 |
| 5,610,082 A | * | 3/1997 | Oh | 438/160 |
| 5,637,519 A | * | 6/1997 | Tsai et al. | 438/160 |
| 5,658,805 A | * | 8/1997 | Young | 438/151 |
| 6,022,753 A | * | 2/2000 | Park et al. | 438/30 |
| 6,184,069 B1 | * | 2/2001 | Wu | 438/155 |
| 6,326,129 B1 | * | 12/2001 | Hirose et al. | 430/312 |
| 6,778,250 B2 | * | 8/2004 | Ahn et al. | 349/187 |
| 8,094,251 B2 | * | 1/2012 | Hung | 349/43 |
| 2008/0206914 A1 | * | 8/2008 | Haase et al. | 438/34 |
| 2008/0224184 A1 | * | 9/2008 | Shannon et al. | 257/288 |
| 2011/0042667 A1 | * | 2/2011 | Kawamura et al. | 257/43 |
| 2013/0077012 A1 | * | 3/2013 | Tada | 349/43 |
| 2014/0011329 A1 | * | 1/2014 | Zhang et al. | 438/158 |

FOREIGN PATENT DOCUMENTS

| TW | 292433 A | 12/1996 |
|---|---|---|
| TW | 200534017 A | 10/2005 |
| TW | 201327002 A | 7/2013 |

* cited by examiner

*Primary Examiner* — Evren Seven

(74) *Attorney, Agent, or Firm* — Novak Druce Connolly Bove + Quigg LLP

(57) ABSTRACT

A display panel manufacturing method includes forming a gate electrode on a substrate and a gate insulator, a semiconductor layer, and an etch stop layer covering the gate electrode. A photoresist layer covering on the etch stop layer is pattern from two opposite side of the substrate by two photolithography processes to form a photoresist pattern. The etch stop layer is dry etched to form an etch stop pattern via the photoresist pattern. The photoresist pattern is formed again by two photolithography processes. The semiconductor layer is wet etched to form a semiconductor pattern via the photoresist pattern. A source electrode and a drain electrode is formed corresponding to two opposite sides of the gate electrode to orderly cover the etch pattern, the semiconductor pattern, and the gate insulator.

10 Claims, 13 Drawing Sheets

DISPLAY PANEL AND MANUFACTURING METHOD THEREOF

FIELD

The disclosure generally relates to display panel manufacturing technologies.

BACKGROUND

An liquid crystal display (LCD) panel employs a number of thin film transistors (TFTS) to control light transmittance of pixels of the LCD panel. Each TFT usually includes a channel layer and an etch stop layer formed on the channel layer. The etch stop layer is used to prevent the channel layer from being etched. However, a specific mask is need to make the etched layer and the specific mask must be precisely aligned with the channel layer, which increases LCD panel cost.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

Figure 1:
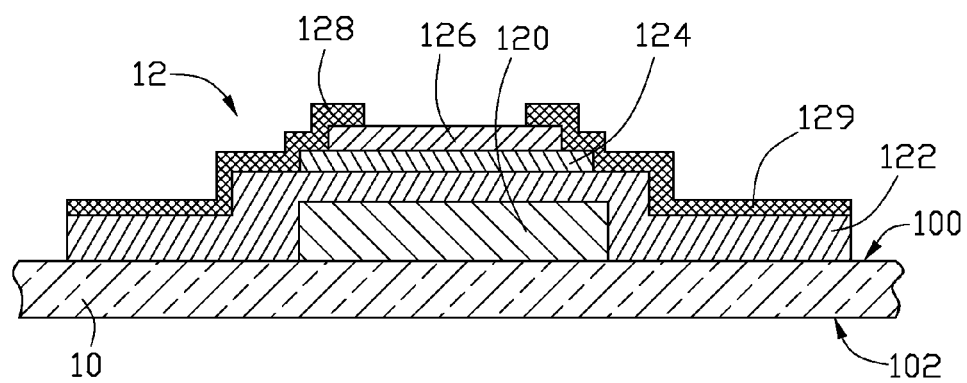
FIG. 1 is a diagrammatic view of a display panel of an exemplary embodiment.

FIG. 1 illustrates a LCD panel 1 of an exemplary embodiment. The LCD panel 1 includes a substrate 10 and a plurality of TFTS 12 arranged as a matrix. Each of the TFTS 12 includes a gate electrode 120, a gate insulator 122, a semiconductor pattern 124, and an etch stop pattern 126, a source electrode 128, and a drain electrode 129. The gate electrode 120 is formed on the substrate 10 and extended along a first direction I (see FIG. 5). The gate insulator 122 is formed to cover the gate electrode 120. The semiconductor pattern 124 is formed on the gate insulator 122. The etch stop pattern 126 is formed to cover a channel area of the semiconductor pattern 124 for preventing the channel area from a damage of an etching solution when the semiconductor pattern 124 is etched. The source electrode 128 and the drain electrode 129 are respectively formed at two symmetric sides of the gate electrode 120 and orderly cover the etch stop pattern 126, the semiconductor pattern 124, and the gate insulator 122. In this embodiment, the semiconductor pattern 124 is made of metal oxide containing zinc, for example, indium gallium zinc oxide (IGZO). The etch stop pattern 126 is made of silicon oxide.

Figure 2:
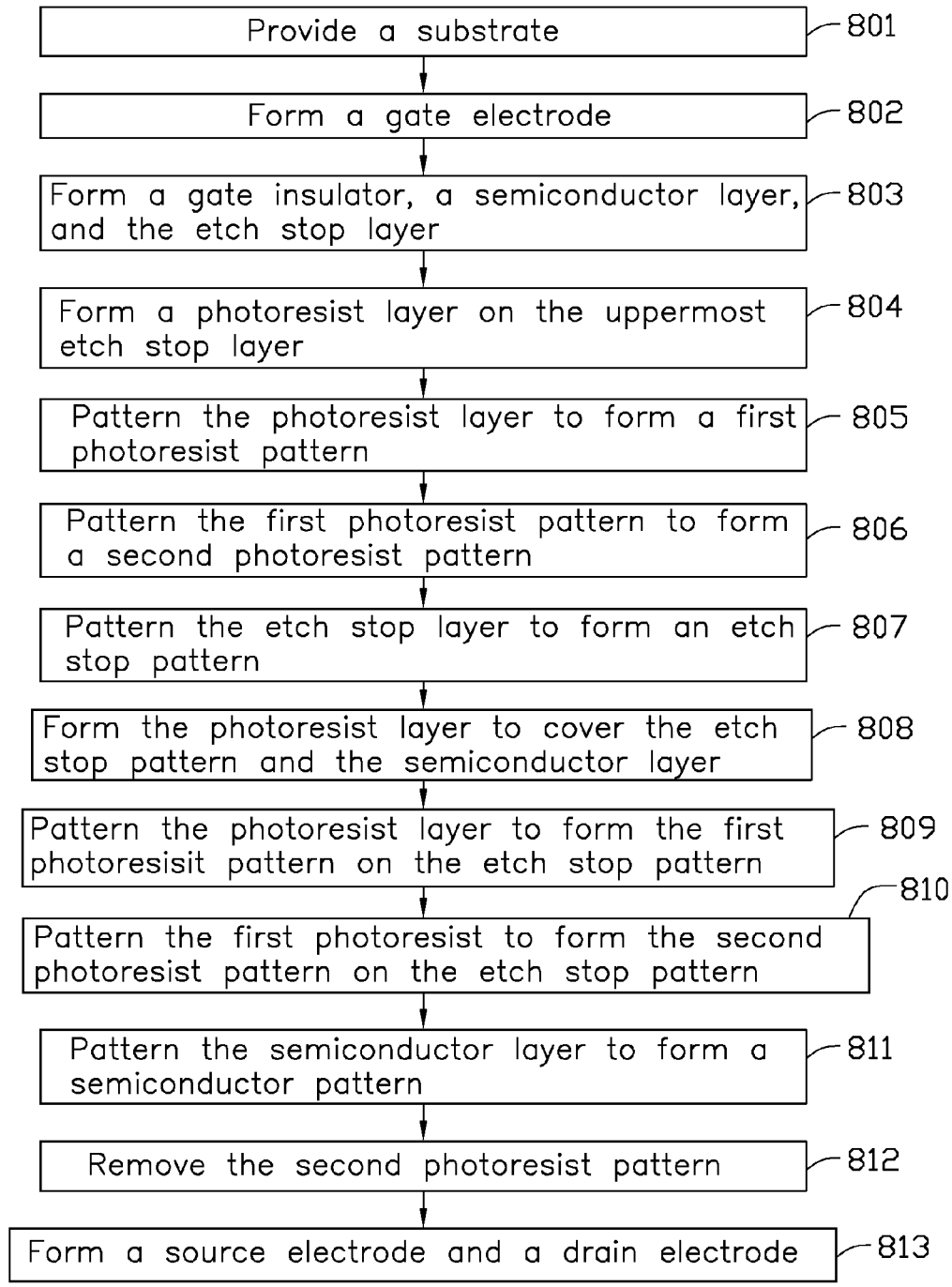
FIG. 2 is a flowchart of an exemplary embodiment of a display panel manufacturing method.

FIG. 2 is a flowchart of an exemplary embodiment of a display panel manufacturing method. FIGS. 3-13 illustrate cross-sectional views corresponding to blocks 801-813, respectively, of FIG. 2.

In block 801, a substrate 10 is provided. The substrate is made of transparent material. The substrate 10 includes a first surface 100 and a second surface 102 parallel to the first surface 100. In this embodiment, the substrate 10 is a glass substrate.

In block 802, a gate electrode 120 is formed on a first surface 100 of the substrate 10. The gate electrode 120 is extended along a first direction I (see FIG. 5).

Figure 3:
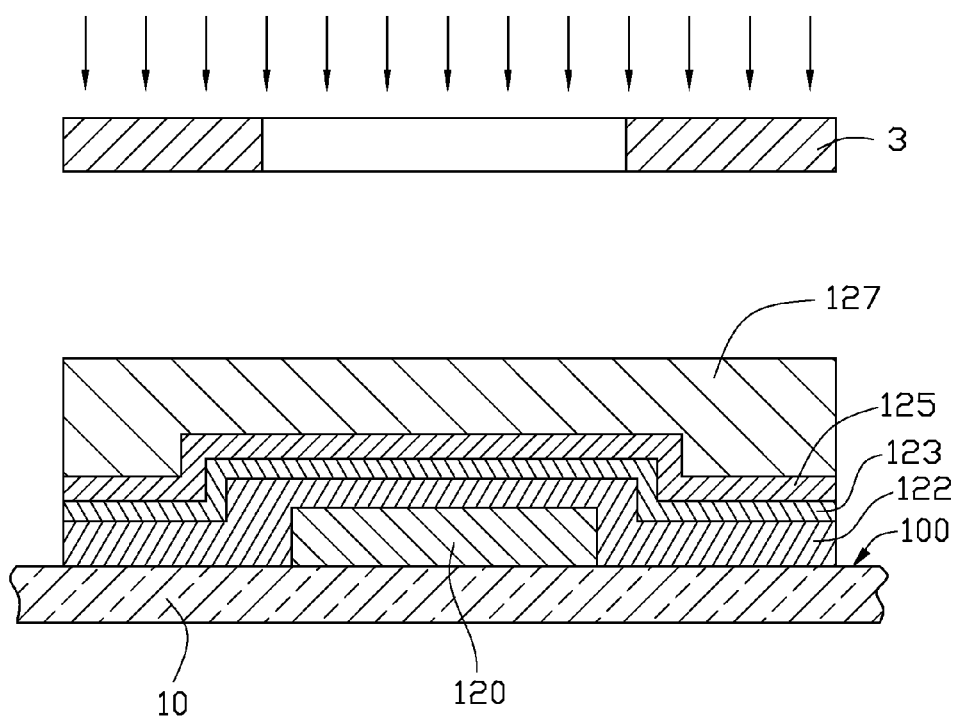
FIGS. 3-13 are cross-sectional views corresponding to blocks 801-813, respectively, of FIG. 2.

In block 803, referring to FIG. 3, a gate insulator 122, a semiconductor layer 123, and the etch stop layer 125 are orderly formed on the first surface 100 to cover the gate electrode 120.

In block 804, a photoresist layer 127 is formed on the uppermost etch stop layer 125.

Figure 4:
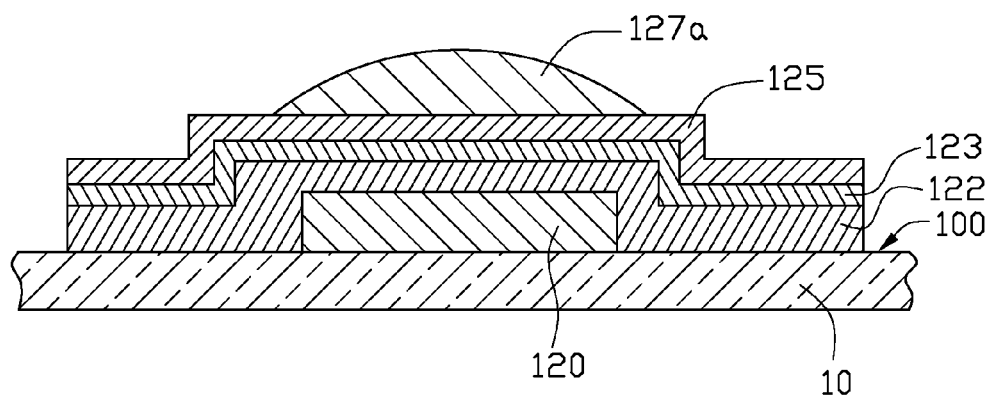
Figure 5:
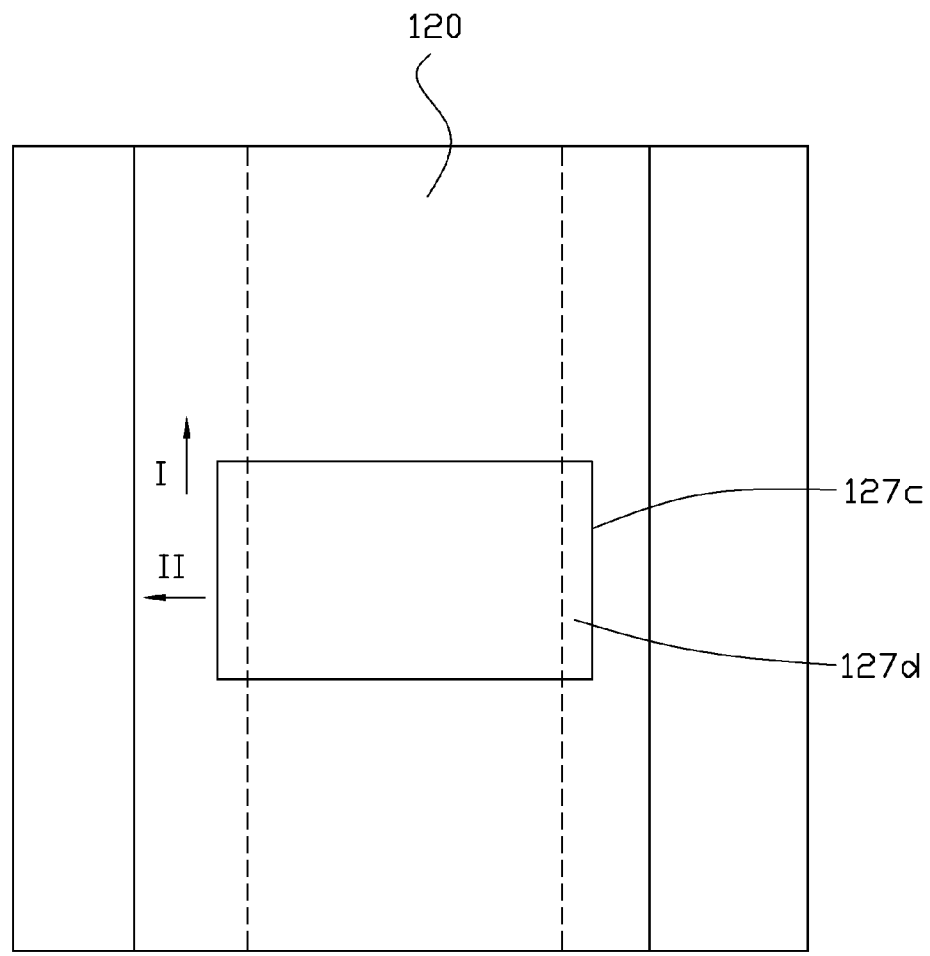

In block 805, the photoresist layer 127 is exposed via a mask 3. Referring to FIG. 4, the exposed photoresist layer 127 is developed to form a first photoresist pattern 127a. FIG. 5 illustrates a top plan view of FIG. 4, referring to FIG. 5, a first area 127c covered by the first photoresist layer 127a is a rectangular area. A longitudinal direction of the first area 127c is defined as extending along a second direction II perpendicular to the first direction I. The first area 127c includes a pair of protruding portions 127d respectively extending out corresponding to two opposite sides of the gate electrode 120. In this embodiment, the protruding portions 127d do not overlap the gate electrode 120.

Figure 6:
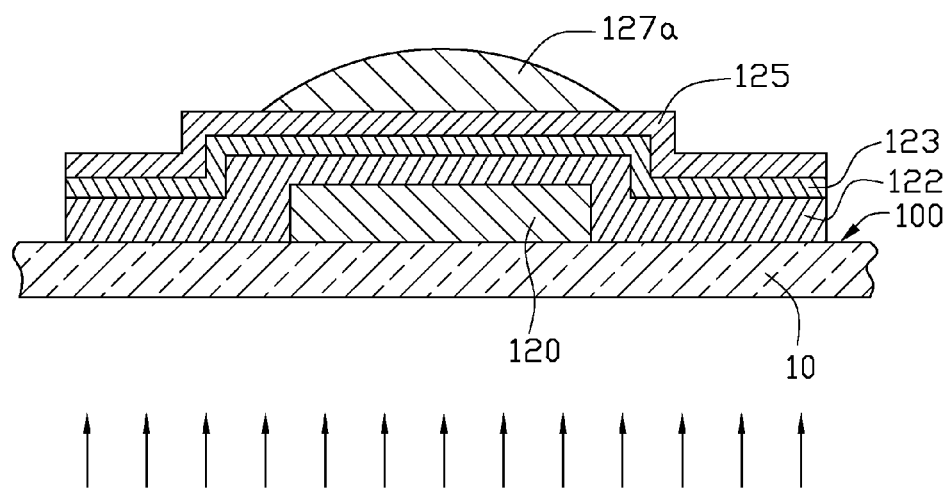
Figure 7:
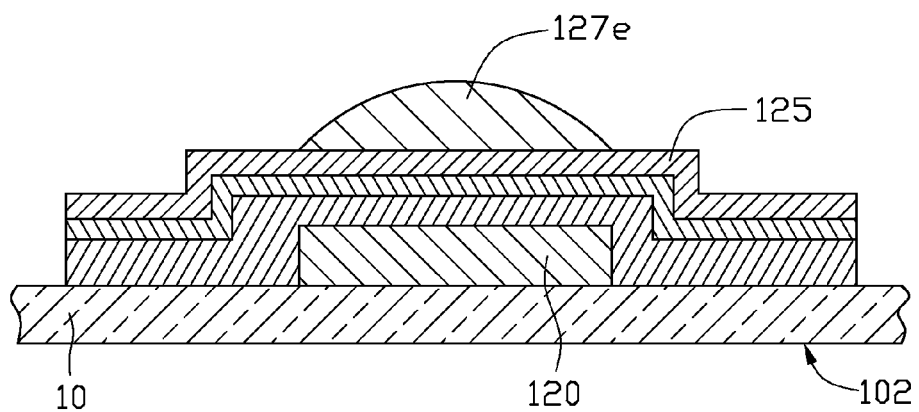
Figure 8:
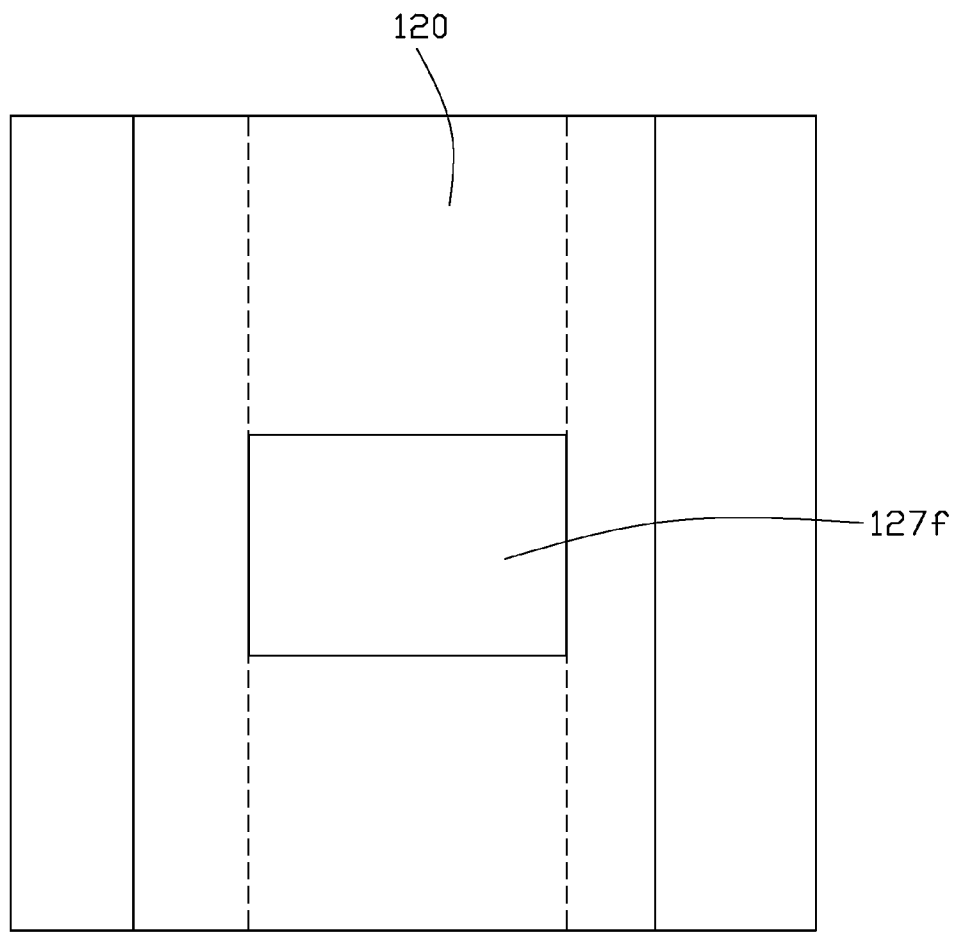

In block 806, referring to FIG. 6, the first photoresist pattern 127a is exposed from the second surface 102 using the gate electrode 120 as a specific mask. Referring to FIG. 7, the exposed first photoresist pattern 127a is developed to form a second photoresist pattern 127e. FIG. 8 is a top plan view of FIG. 7, referring to FIG. 8, comparing with the first area 127c (see FIG. 5), a second area 127f covered by the second photoresist pattern 127e is formed by removing the pair of the protruding portions 127d (see FIG. 5).

Figure 9:
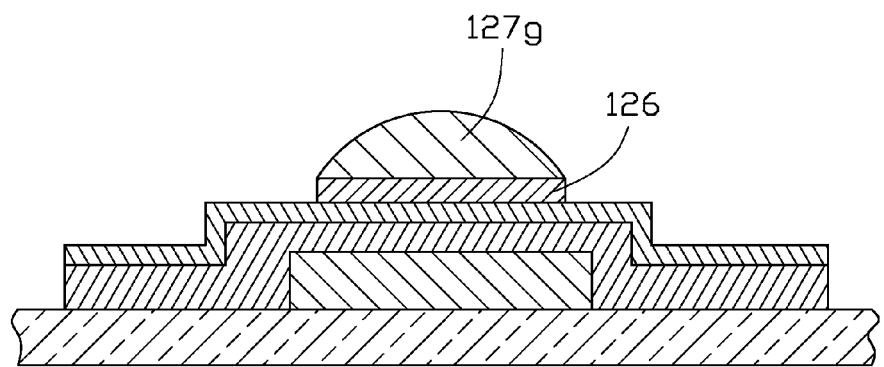
Figure 10:
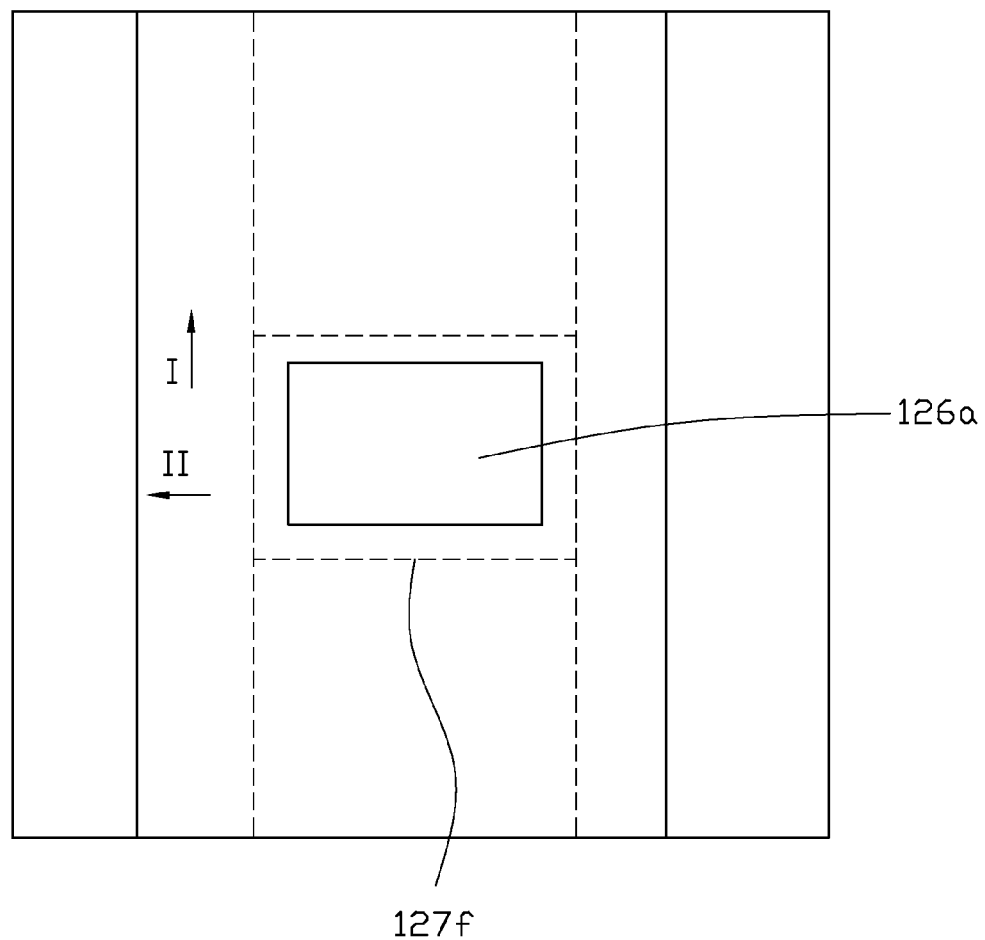

In block 807, referring to FIGS. 7, 9 and 10, the etch stop layer 125 is etched via a dry etch process. The etch stop layer 126 is etched to form an etch stop pattern 126 covering a third area 126a smaller than the second area 127f. Because the second photoresist pattern 127e is etched at the same time with the etch stop layer 125, the second photoresist pattern 127e is etched to form a third photoresist pattern 127g which is smaller than the second photoresist pattern 127e. The etch stop pattern 126 defines a channel area on the semiconductor pattern 124 (see FIG. 1), thus the etch stop pattern 126 can completely protect the channel area of the semiconductor pattern 124. Because the etch stop layer 125 is made of silicon oxide which is very hard, an etching rate of the dry etch process is slow and the size of the etch stop pattern 126 can be precisely controlled. In this embodiment, the etch stop pattern 126 is shortened about 1.75 micrometer (μm) along the second direction II by the dry etch process. The second direction II is defined as a longitudinal direction of the channel area.

In block 808, the third photoresist pattern 127g is removed. The photoresist layer (not shown) is formed again to cover the etch stop pattern 126 and the semiconductor layer 123.

Figure 11:
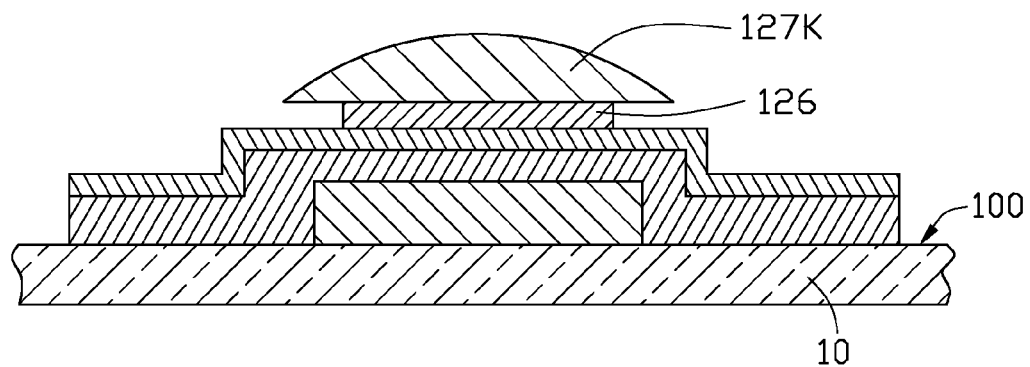

In block 809, referring to FIG. 11, a second photoresist layer (not shown) is exposed from the first surface 100 via the mask (not shown of FIG. 3) and developed to form a fourth photoresist pattern 127K on the etch stop pattern 126.

Figure 12:
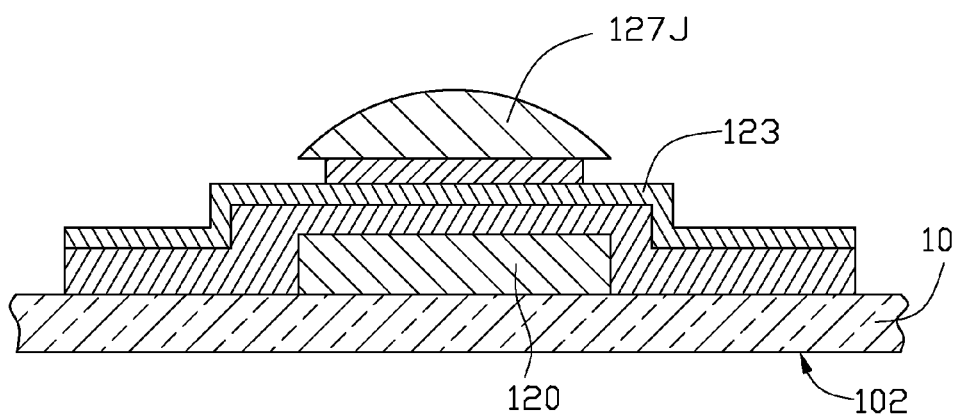

In block 810, referring to FIG. 12, the fourth photoresist pattern 127K is exposed from the second surface 102 using the gate electrode 120 as the specific mask and then developed to form a fifth photoresist pattern 127J.

Figure 13:
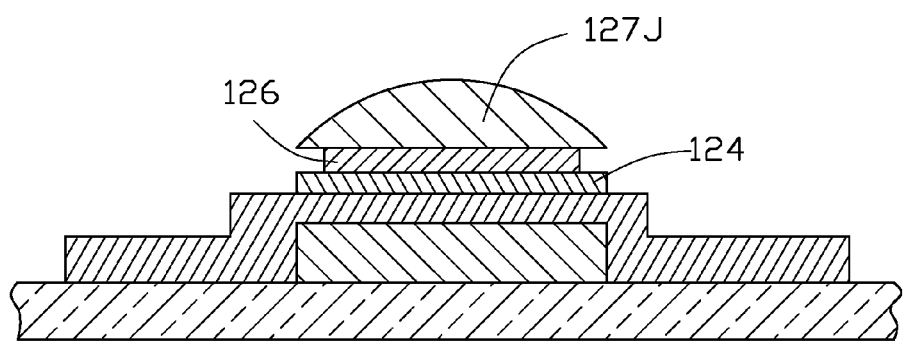

In block 811, referring to FIG. 13, the semiconductor layer 123 is etched to form a semiconductor pattern 124 corresponding to fifth photoresist pattern 127J via a second wet etch process. That is, the etch stop pattern 126 is smaller than the semiconductor pattern 124. The etch stop pattern 126 only cover the channel area of the semiconductor pattern 124. In this embodiment, an etching solution of the wet etch process is oxalic acid.

In block 812, fifth photoresist pattern 127J remaining after the wet etch process is removed.

In block 813, referring to FIG. 1, a source electrode 128 and a drain electrode 129 are respectively formed at two symmetric sides of the gate electrode 120. Both of the source electrode 128 and the drain electrode 129 orderly cover the etch stop pattern 126, the semiconductor pattern 124, and the gate insulator 122.

It is believed that the present embodiments and their advantages will be understood from the foregoing description, and it will be apparent that various changes may be made thereto without departing from the scope of the disclosure or sacrificing all of its material advantages.

What is claimed is:

1. A method of manufacturing a display panel, the method comprising, in sequence:

providing a substrate, the substrate comprising a first surface and a second surface opposite to the first surface;

forming a gate electrode extending along a first direction on the first surface;

forming a gate insulator, a semiconductor layer, and an etch stop layer to cover the gate electrode;

forming a photoresist layer to cover the etch stop layer;

patterning the photoresist layer by exposing the photoresist layer to light incident to the first surface through a first mask, thereby forming a first photoresist pattern;

patterning the first photoresist pattern by exposing the first photoresist pattern to light incident the second surface, using the gate electrode as a second mask, thereby forming a second photoresist pattern from the second surface by using the gate electrode as a second mask;

etching the etch stop layer by a dry etch process using the second photoresist pattern as a first etching mask to form an etch stop pattern having a smaller surface area than the second photoresist pattern;

removing the second photoresist pattern remaining after the dry etch process and forming a second photoresist layer to cover the etch stop pattern and the semiconductor layer;

patterning the second photoresist layer by exposing the second photoresist layer to light incident first surface using the first mask, thereby forming a fourth photoresist pattern on the etch stop pattern;

patterning the fourth photoresist pattern by exposing the fourth photoresist pattern to light incident the second surface using the gate electrode as the second mask thereby forming a fifth photoresist pattern;

etching the semiconductor layer by a second wet etch process using the fifth photoresist pattern as a second etching mask to form a semiconductor pattern corresponding to the second photoresist pattern;

removing the forth photoresist pattern remaining after the second wet etch process; and forming a source electrode and a drain electrode respectively at two symmetric sides of the gate electrode, and both of the source electrode and drain electrode covering the etch stop pattern, the semiconductor pattern, and the gate insulator.

2. The manufacturing method of claim 1, wherein the semiconductor layer is made of indium gallium zinc oxide.

3. The manufacturing method of claim 1, wherein a first area covered by the first photoresist pattern is a rectangular area, a longitudinal direction of the first area is extended along a second direction perpendicular to the first direction, and the first area comprises a pair of protruding portions respectively extending out corresponding to two opposite sides of the gate electrode.

4. The manufacturing method of claim 3, wherein a second area covered by the second photoresist pattern is formed by removing the pair of protruding portions comparing with the first area.

5. The manufacturing method of claim 3, wherein the etch stop pattern is shortened about 1.75 micrometer along the second direction by the dry etch process.

6. The manufacturing method of claim 3, wherein an area covered by the etch stop pattern is defined as a channel area of the semiconductor layer.

7. The manufacturing method of claim 6, wherein the second direction is defined as a longitudinal direction of the channel area.

8. The manufacturing method of claim 1, wherein the etch stop layer is made of silicon oxide.

9. The manufacturing method of claim 1, wherein an etching solution of the wet etch process is oxalic acid.

10. The manufacturing method of claim 1, wherein the substrate is a transparent glass substrate.

* * * * *